United States Patent
Watanabe et al.

(10) Patent No.: US 7,595,966 B2
(45) Date of Patent: Sep. 29, 2009

(54) MULTI-VALUED DATA RECORDING SPIN INJECTION MAGNETIZATION REVERSAL ELEMENT AND DEVICE USING THE ELEMENT

(75) Inventors: Hideaki Watanabe, Kawaguchi (JP); Akira Saito, Yokosuka (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 561 days.

(21) Appl. No.: 11/530,931

(22) Filed: Sep. 12, 2006

(65) Prior Publication Data
US 2008/0062578 A1    Mar. 13, 2008

(30) Foreign Application Priority Data
Sep. 12, 2005    (JP) .............................. 2005-263923

(51) Int. Cl.
*G11B 5/39* (2006.01)
(52) U.S. Cl. .............................. 360/324.12; 360/324.2
(58) Field of Classification Search ................ 360/324, 360/1, 324.11, 324.12, 324.2
See application file for complete search history.

(56) References Cited

U.S. PATENT DOCUMENTS

2004/0165425 A1    8/2004  Nakamura et al.
2006/0120126 A1*   6/2006  Nakamura et al. ............ 365/33
2006/0238191 A1*  10/2006  Saito ............................ 324/252
2007/0217256 A1*   9/2007  Ono ............................. 365/171
2008/0013222 A1*   1/2008  Okuno et al. .............. 360/324.1
2009/0015958 A1*   1/2009  Nakamura et al. ............ 360/55
2009/0091863 A1*   4/2009  Hosotani et al. .......... 360/324.2
2009/0097167 A1*   4/2009  Sato et al. .................... 360/324

OTHER PUBLICATIONS

Katine, J. A et al.; "Current-Driven Magnetization Reversal and Spin-Wave Excitations in Co/ Cu/ Co Pillars"; Physical Review Letters, Apr. 3, 2000, pp. 3149-3152, vol. 84, No. 14; The American Physical Society.

* cited by examiner

*Primary Examiner*—Jefferson Evans
(74) *Attorney, Agent, or Firm*—Rossi, Kimms & McDowell, LLP

(57) ABSTRACT

A spin injection magnetization reversal device is disclosed which inhibits an increase in resistance to enable multi-valued data recording. A ferromagnetic fixed layer and n groups each including a ferromagnetic free layer and an isolation layer are disclosed. The groups are disposed from the group including the first ferromagnetic free layer provided on the ferromagnetic fixed layer to the group including the n-th ferromagnetic free layer in the order. Each of the ferromagnetic free layers is preferably formed of one of a CoCrPt alloy, a CoCr alloy and a CoPt alloy with Pt or Cu concentration therein made monotonically decreased from the concentration in the first ferromagnetic free layer to that in the n-th ferromagnetic free layer.

14 Claims, 9 Drawing Sheets

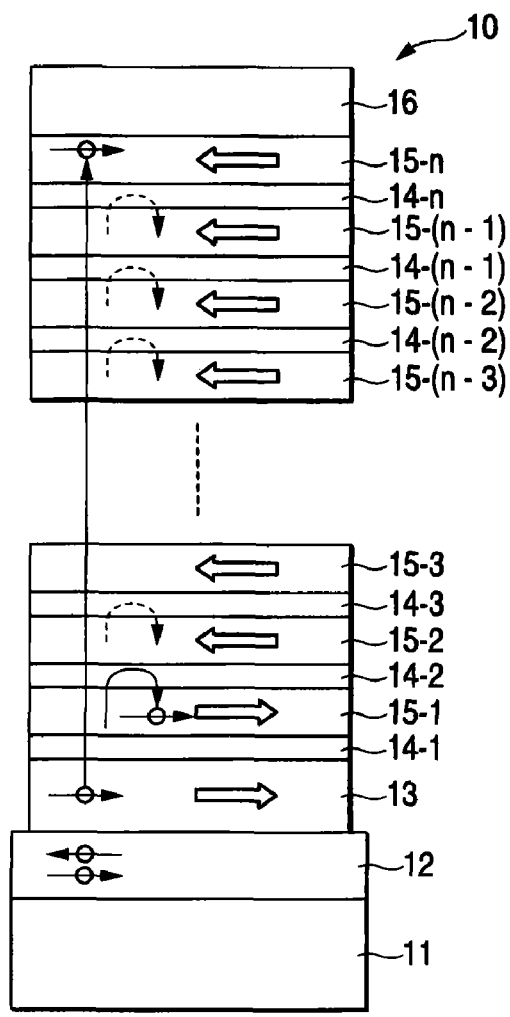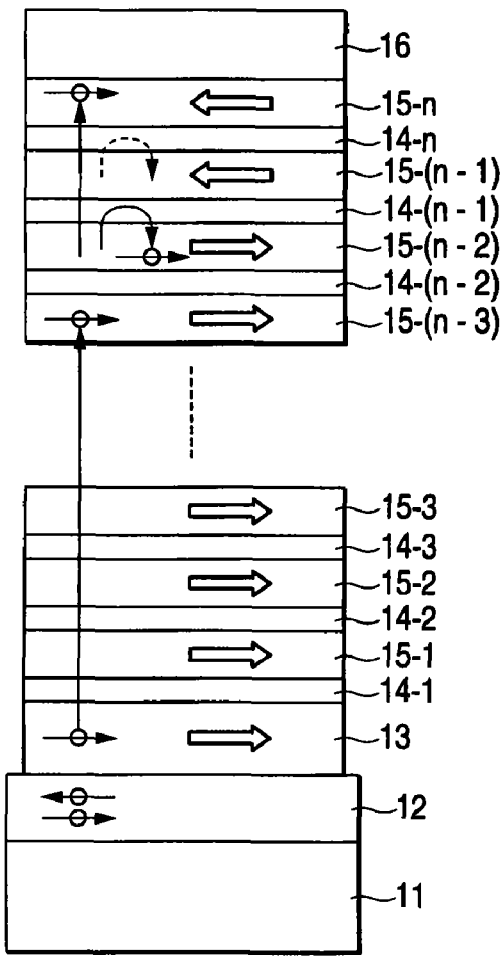

MULTI-VALUED DATA RECORDING SPIN INJECTION MAGNETIZATION REVERSAL ELEMENT AND DEVICE USING THE ELEMENT

CROSS REFERENCE TO RELATED APPLICATIONS

This application claims priority from application Serial No. JP 2005-263923, filed on Sep. 12, 2005, the contents of which are incorporated herein by reference in their entirety.

BACKGROUND OF THE INVENTION

A. Field of the Invention

The present invention relates to a basic structure element forming a magnetic memory or a magnetic sensor and a device using the element. More specifically, the invention relates to an element that controls electron spin injection to form a magnetic random access memory capable of multi-valued data recording, and a device using the element.

B. Description of the Related Art

In recent years, a giant magneto-resistance (GMR) effect element made up of layers arranged as a ferromagnetic layer/a nonmagnetic metal layer/a ferromagnetic layer and a tunnel magneto-resistance (TMR) effect element made up of layers arranged as a ferromagnetic layer/an insulator layer/a ferromagnetic layer have been developed with an expectation of application to a new magnetic sensor or a magnetic memory (MRAM: Magnetic Random Access Memory). FIG. 8A is a view showing a basic structure of an MRAM. As shown in FIG. 8A, in an MRAM, bit lines 52 and word lines 56 are arranged in a matrix-like form with element 50 such as a TMR magnetic memory element disposed at each of intersections of bit lines 52 and word lines 56. An example of an arrangement of TMR magnetic memory element 50 driven by a magnetic field produced by a current is as shown in a schematic cross sectional view of FIG. 8B. In FIG. 8B, the arrangement is shown as that in the case in which the coercive force (Hc) of second ferromagnetic layer 55 is higher than that of a first ferromagnetic layer 53. When writing logical information in the TMR element, the writing is carried out by letting a current flow in an additionally provided writing word line 57 to produce a magnetic field. By adjusting the direction and the strength of a magnetic field produced at this time, the direction of magnetization of first ferromagnetic layer 53 and that of second ferromagnetic layer 55 are made in parallel or in anti-parallel with each other, and information of "1" or "0" is stored. Read-out of stored information is carried out by letting a current flow from word line 56 to bit line 52 and reading a resistance value of the element appeared by the TMR effect when the current passes through insulation layer 54. In this way, logical information can be recorded into and regenerated from the TMR element. With the arrangement, however, only the binary data of "1" and "0", i.e., information of only 1 bit can be recorded and regenerated in one memory cell. This is insufficient for the requirement for high-density recording and regeneration in the future. Furthermore, magnetic field production by means of a current requires large electric power consumption for writing information.

As a means of solving the problem, a proposal was made in which information writing is not carried out by a magnetic field produced by a current, but is instead carried out by direct injection of spin-polarized electrons. At present, attention has been focused on this proposal (see J. A. Katine et al., "Current-Driven Magnetization Reversal and Spin-Wave Excitations in Co/Cu/Co Pillars," *Physical Review Letters*, Vol. 84, No. 14, pp. 3149-3152 (2000), for example).

FIGS. 9A and 9B are schematic cross sectional views that explain an example of an arrangement and an operation principle of a related magnetic memory element that carries out recording and regeneration of binary information data by using magnetization reversal due to electron spin injection (see US2004/0165425 A1, for example). The memory element is made up of first ferromagnetic fixed layer 131, first isolation layer 141, first ferromagnetic free layer 151, second isolation layer 142 and second ferromagnetic fixed layer 132. FIG. 9A also shows states of electron spins and magnetization in ferromagnetic layers when electrons are made to flow in the element from second ferromagnetic fixed layer 132 toward first ferromagnetic fixed layer 131. In the figure, an open arrow represents the direction of magnetization in each ferromagnetic layer, an arrow with a small circle represents the direction of the spin of an electron and a thin arrow without circle represents the direction in which electrons flow (this is similar in the following drawings). Moreover, in the following explanations, the direction of magnetization is to be referred to as "rightward" or "leftward" in correspondence with the direction of the open arrow in the figure. This is similar about the direction of the electron spin. First, the spins of electrons passing second ferromagnetic fixed layer 132 are aligned in the direction of the magnetization of second ferromagnetic fixed layer 132 by interactions (s-d interactions) with spins of magnetic metal atoms in second ferromagnetic fixed layer 132 (polarization of spins is caused). The electrons with polarized spins flowing into first ferromagnetic free layer 151 cause the spin angular momentum of the electrons to be transferred to the magnetic metal atoms in first ferromagnetic free layer 151 to affect the magnetization of first ferromagnetic free layer 151. The direction of magnetization of first ferromagnetic fixed layer 131 is opposite to the direction of magnetization of second ferromagnetic fixed layer 132. Therefore, at the interface at which electrons flow into first ferromagnetic fixed layer 131, electrons with rightward spins, spins in the same direction as the direction of the magnetization of second ferromagnetic fixed layer 132, are reflected. The rightward spins possessed by the reflected electrons also affect the magnetization of first ferromagnetic free layer 151. Namely, electrons with rightward spins, spins in the same direction as the direction of the magnetization of second ferromagnetic fixed layer 132, affect the magnetization of first ferromagnetic free layer 151 twice, by which substantially two times of writing action can be obtained. As a result, it is considered that writing in first ferromagnetic free layer 151 can be carried out with a current smaller than that in a related system with a magnetic field produced by a current.

Reversal of the direction of the magnetization in first ferromagnetic free layer 151 is carried out by letting electrons flow from first ferromagnetic fixed layer 131 toward second ferromagnetic fixed layer 132. The states of electron spins and magnetization in the ferromagnetic layers at this time are shown in FIG. 9B. In this case, the electron spins are affected by the magnetization in first ferromagnetic fixed layer 131 to be made directed leftward on the paper. The electrons with the spins in first ferromagnetic free layer 151 affect the magnetization thereof. Furthermore, the electrons with leftward spins are reflected at the interface with second ferromagnetic fixed layer 132 magnetized in the direction opposite to that of the spins to affect the magnetization of first ferromagnetic free layer 151 again. Thus, an arrangement is proposed in which, with two ferromagnetic fixed layers prepared with magnetization thereof being opposite to each other, the direction of a current made to flow in the element is changed to thereby write binary information into first ferromagnetic free layer 151.

Moreover, an arrangement is proposed in which a number of elements of this kind are stacked to thereby carry out multi-valued data recording (see paragraphs [0142] and [0143] in US2004/0165425 A1, for example). FIG. 10 is a schematic cross sectional view for explaining an arrangement of a spin injection magnetization reversal element carrying out multi-valued data recording, which is disclosed in US2004/0165425 A1. The element, using element terms used in this specification, includes first ferromagnetic fixed layer 131, first isolation layer 141, first ferromagnetic free layer 151, second isolation layer 142, second ferromagnetic fixed layer 132, third isolation layer 143, second ferromagnetic free layer 152, fourth isolation layer 144 and third ferromagnetic fixed layer 133. In the figure, a layer with two open arrows indicating their respective directions as being opposite to each other shows that the direction of magnetization in the layer is variable. The element basically has an arrangement in which two elements, each shown in FIG. 9, are stacked, though they share second ferromagnetic fixed layer 132. It is considered that changes in magnetic materials and film thicknesses of first ferromagnetic free layer 151 and second ferromagnetic free layer 152 change a critical current density for reversing the direction of magnetization (hereinafter referred to as a magnetization reversal current density) in each of the layers to thereby enable multi-valued data recording.

The above-explained arrangement is based on the concept that multi-valued data recording is carried out by stacking a plurality of elements each carrying out binary data recording. Therefore, for each layer of the ferromagnetic free layers recording magnetization reversal, at least one layer of the ferromagnetic fixed layer must be disposed. This increases the number of the ferromagnetic fixed layers as the number of multi-valued data increases. The ferromagnetic fixed layer, however, is required to have a sufficiently large thickness for fixing magnetization without easily causing variation. As a result, in the case of providing a plurality of ferromagnetic fixed layers, element resistance is to be increased to increase power consumption when the element is in operation.

Moreover, since multi-valued information is recorded by varying the magnetization reversal current densities in a plurality of ferromagnetic free layers, a design guideline becomes important for setting the magnetization reversal current densities at values different from one another. For such a design guideline for the ferromagnetic free layers, a proposal of varying the thicknesses of respective ferromagnetic free layers is presented. This, however, is not a preferable measure because an increase in the layer thickness causes an increase in a resistance value which results in an increase in power consumption. In addition, in the present situation, no specific criterion is presented about determination of a magnetic material when a ferromagnetic free layer is designed.

The present invention was made by giving attention to the above-explained points, and it is an object of the present invention to provide an arrangement that enables multi-valued data recording with an increase in resistance in the element suppressed. A further object of the invention is to provide criteria for determining magnetic materials and the compositions thereof by which a plurality of ferromagnetic free layers with their respective values of critical currents for magnetization reversal distinctly different from one another can be formed without varying their respective thicknesses.

SUMMARY OF THE INVENTION

The foregoing problem was solved by the invention and made on the basis of finding that a plurality of ferromagnetic free layers, stacked on a ferromagnetic fixed layer with nonmagnetic isolation layers put between the ferromagnetic free layers, enables multi-valued data recording while minimizing the number of the ferromagnetic fixed layers.

More specifically, a spin injection magnetization reversal element according to the invention is characterized by including a ferromagnetic fixed layer in which the direction of magnetization thereof is substantially fixed in one direction, a plurality of ferromagnetic free layers with the number of the layers being n from a first ferromagnetic free layer to an n-th layer, in each of which the direction of magnetization is variable, and a plurality of nonmagnetic isolation layers with the number of the layers being n. In the element, the first ferromagnetic free layer is disposed closest to the ferromagnetic fixed layer and the n-th ferromagnetic free layer is disposed farthest from the ferromagnetic fixed layer. The n ferromagnetic free layers from the first ferromagnetic free layer to the n-th ferromagnetic free layer are disposed such that one of the isolation layers is disposed between the ferromagnetic fixed layer and the first ferromagnetic free layer, and each of the rest of the isolation layers is disposed in each region between neighboring ferromagnetic free layers. The direction of magnetization of each of the ferromagnetic free layers is varied by electron spin injection, and letting j be a number given as $1 \leq j \leq n$ and letting a magnetization reversal current density in a j-th ferromagnetic free layer be $Ic_j$, a relation of $Ic_{j-1} > Ic_j$ (where $2 \leq j \leq n$) is satisfied in the ferromagnetic layers.

As an alternative, the spin injection magnetization reversal element according to the invention is characterized in that, letting a uniaxial magnetic anisotropy constant in a j-th ferromagnetic free layer be $Ku_j$, a relation of $Ku_{j-1} > Ku_j$ (where $2 \leq j \leq n$) is satisfied in the ferromagnetic free layers.

Letting a coercive force in the j-th ferromagnetic free layer be Hc, a relation of $Hc_{j-1} > Hc_j$ (where $2 \leq j \leq n$) is preferably satisfied in the ferromagnetic free layers.

Moreover, letting a saturation magnetization in the j-th ferromagnetic free layer be $Ms_j$, a relation of $Ms_{j-1} > Ms_j$ (where $2 \leq j \leq n$) is preferably satisfied in the ferromagnetic free layers.

Each of the ferromagnetic free layers is preferably formed of one of a CoCrPt alloy, a CoCr alloy and a CoPt alloy.

When the above alloy is used, letting a Cr concentration in the j-th ferromagnetic free layer be $C_j$, relations of $C_{j-1} > C_j$ (where $2 \leq j \leq n$) and 0.1 atomic % $\leq C_j \leq$ 20 atomic % (where $1 \leq j \leq n$) are preferably satisfied.

As an alternative, letting a Pt concentration in the j-th ferromagnetic free layer be $P_j$, relations of $P_{j-1} > P_j$ (where $2 \leq j \leq n$) and 0.1 atomic % $\leq C_j \leq$ 20 atomic % (where $1 \leq j \leq n$) are preferably satisfied.

A value in which the length of each of the ferromagnetic free layers is divided by the width thereof is preferably 2 or more.

A material of each of the isolation layer is preferably nonmagnetic metal. In particular, the nonmagnetic metal is preferably Cu.

As an alternative, a material of each of the isolation layer is preferably an insulator. In particular, the insulator is preferably $Al_2O_3$.

Moreover, a fixed layer electrode is preferably provided on the surface of the ferromagnetic fixed layer on the side opposite to the ferromagnetic free layers, and a free layer electrode is preferably provided on the surface of the n-th ferromagnetic free layer on the side opposite to the ferromagnetic fixed layer.

Furthermore, a nonmagnetic isolation layer and a ferromagnetic supplementary fixed layer are preferably further provided in this order on the surface of the n-th ferromagnetic free layer on the side opposite to the ferromagnetic fixed layer with the direction of magnetization of the ferromagnetic supplementary fixed layer substantially fixed in a second direction opposite to a first direction as the one direction.

A magnetic memory device according to the invention is characterized by using any one of the spin injection magnetization reversal elements described above.

By forming a spin injection magnetization reversal element as explained above, multi-valued data recording becomes possible with the number of ferromagnetic fixed layers, each having a large thickness with large electric resistance, reduced to a minimum. As a result, an increase in the electric resistance of the element is inhibited to enable reduction in electric power consumption. Moreover, by providing the ferromagnetic free layers as explained above, it becomes possible to arrange magnetization reversal current densities in the respective ferromagnetic free layers in the desired order. As a result, a multi-valued data recording element that can be stably operated is feasible without varying the thickness of each of the ferromagnetic free layers.

By using a CoCrPt alloy, a CoCr alloy or a CoPt alloy as the material of the ferromagnetic free layer, it becomes possible to determine Ku and Hc over a wide range. This makes it easy to arrange magnetization current densities in the respective ferromagnetic free layers in the desired order and, along with this, makes it possible to increase the number of stably operating ferromagnetic free layers.

BRIEF DESCRIPTION OF THE DRAWINGS

The foregoing advantages and features of the invention will become apparent upon reference to the following detailed description and the accompanying drawings, of which:

FIGS. 4A and 4B are schematic cross sectional views for explaining an operation principle of reading out in the magnetic memory element according to the invention when letting a current flow in the direction from a free layer electrode toward a fixed layer electrode;

DETAILED DESCRIPTION OF SPECIFIC EMBODIMENTS

Figure 1:
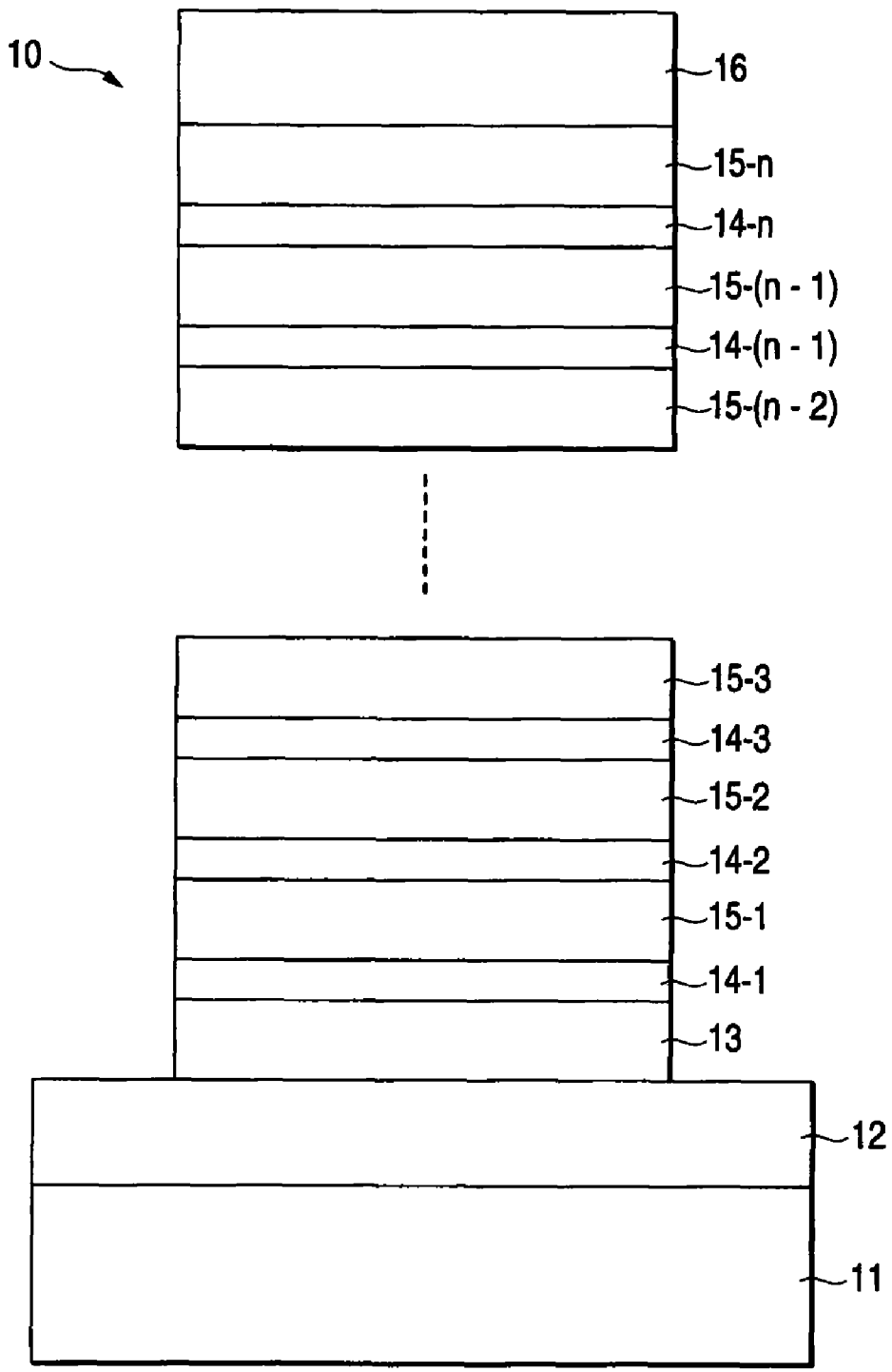
FIG. 1 is a schematic cross sectional view for explaining an example of the arrangement of a magnetic memory element according to the invention.

In the following, preferred embodiments of the invention will be explained with reference to attached drawings. FIG. 1 shows an example of the arrangement of magnetic memory element 10 according to the invention, which is shown in a schematic cross sectional view. On substrate 11, fixed layer electrode 12 and ferromagnetic fixed layer 13 are formed, on which a plurality of ferromagnetic free layers are formed. Ferromagnetic free layers adjacent to each other are formed with an isolation layer provided between the adjacent ferromagnetic free layers so they are spaced apart. The element shown in FIG. 1 is an example of providing n layers of the ferromagnetic free layers. In the example, on ferromagnetic fixed layer 13, a first ferromagnetic free layer 15-1 is formed with first isolation layer 14-1 provided between. On first ferromagnetic free layer 15-1, second ferromagnetic free layer 15-2 is formed with second isolation layer 14-2 provided in between. Thereafter, this is repeated until an n-th ferromagnetic free layer is formed. Finally, free layer electrode 16 is formed.

Magnetization reversal current densities in the respective ferromagnetic free layers are determined so that the current density in first ferromagnetic free layer 15-1 is given as the maximum, the current density in n-th ferromagnetic free layer 15-n is given as the minimum, and the current densities in first ferromagnetic free layer 15-1 to n-th ferromagnetic free layer 15-n are monotonically reduced. Namely, letting the magnetization reversal current density in the j-th ferromagnetic free layer be $Ic_j$, the current densities are determined so as to be $Ic_{j-1} > Ic_j$ (where $2 < j < n$).

Alternatively, the uniaxial magnetic anisotropy constants in the respective ferromagnetic free layers are determined so that the constant in first ferromagnetic free layer 15-1 is given as the maximum, the constant in n-th ferromagnetic free layer 15-n is given as the minimum, and the constants in first ferromagnetic free layer 15-1 to n-th ferromagnetic free layer 15-n are monotonically reduced. Namely, letting the uniaxial magnetic anisotropy constant in the j-th ferromagnetic free layer be $Ku_j$, the constants are determined so as to be $Ku_{j-1} > Ku_j$ (where $2 \leq j \leq n$).

Operation Principle

First, an explanation will be made about an operation principle of the magnetic memory element according to the invention.

Figure 2A:
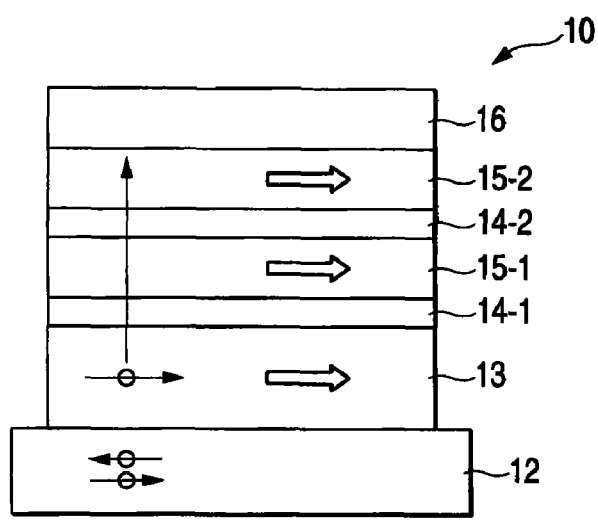
FIGS. 2A to 2C are schematic cross sectional views for explaining an operation principle when carrying out writing into the magnetic memory element according to the invention.
Figure 2B:
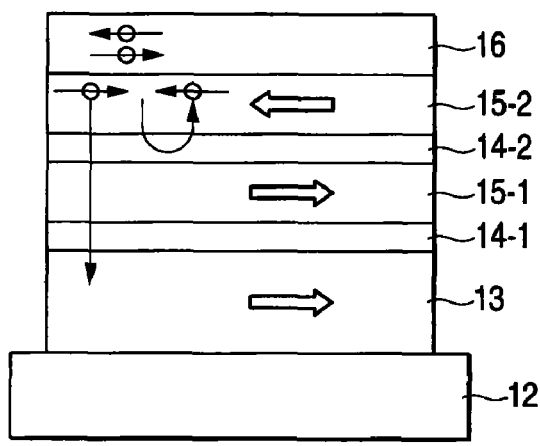
Figure 2C:
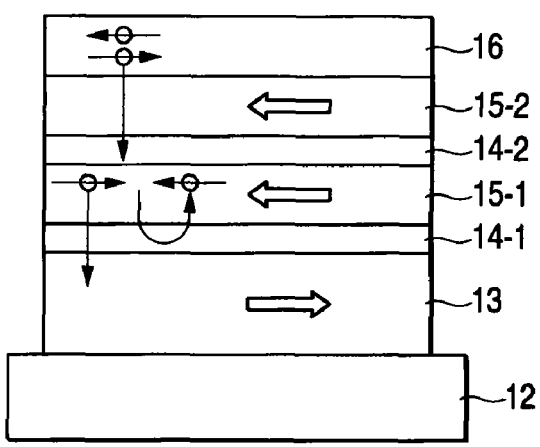

FIGS. 2A to 2C are schematic cross sectional views for explaining the operation principle when carrying out writing into the element. For simplicity, the figures show the case in which two layers of magnetic free layers are provided in the element.

FIG. 2A shows the case of aligning the directions of magnetization in each ferromagnetic free layer and the ferromagnetic fixed layer in the same direction. Flow of a current from free layer electrode 16 toward fixed layer electrode 12 causes electrons to be injected from fixed layer electrode 12 into ferromagnetic fixed layer 13. In fixed layer electrode 12, the distribution of electrons with rightward spins matches the distribution of electrons with leftward spins. In ferromagnetic fixed layer 13, due to interaction between the electron spins and the spins of magnetic metal atoms (s-d interaction) and the large thickness of ferromagnetic fixed layer 13, the electron spins are aligned in the direction of the magnetization of ferromagnetic fixed layer 13 (rightward). When the thus spin-polarized electrons are injected into first ferromagnetic free layer 15-1 through first isolation layer 14-1 and further into second ferromagnetic free layer 15-2 through second isolation layer 14-2, each of the electrons exerts a torque that directs the direction of the magnetization of each of the ferromagnetic free layers in the direction in parallel with the direction of magnetization of ferromagnetic fixed layer 13. When the current density I of the current injected from free layer electrode 16 is sufficiently large that it is larger than the magnetization reversal current density in each of the ferromagnetic free layers, that is, $I > Ic_1 > Ic_2$, the directions of magnetization in first ferromagnetic free layer 15-1 and second ferromagnetic free layer 15-2 transfer to the state in parallel with the direction of magnetization of ferromagnetic fixed layer 13. The state is referred to as the state of the logical value "0".

Next to this, transition to the state of the logical value "1" will be explained. FIG. 2B shows the case of letting a current, having the current density I given as $Ic_1 > I > Ic_2$, flow in the state of the logical value "0" from fixed layer electrode 12 toward free layer electrode 16. In this case, electrons are injected from free layer electrode 16 into second ferromagnetic free layer 15-2. In free layer electrode 16, the distribution of electrons with rightward spins matches the distribution of electrons with leftward spins. Moreover, the electrons injected into second ferromagnetic free layer 15-2 have similar distribution. Therefore, in second ferromagnetic free layer 15-2, the electrons directly injected from free layer electrode 16 exert no torque of reversing the direction of the magnetization. However, as shown in FIG. 2B, electrons with leftward spins in anti-parallel with the direction of the magnetization in first ferromagnetic free layer 15-1 are reflected at the surface of first ferromagnetic free layer 15-1 to be injected into second ferromagnetic free layer 15-2 again. This is due to the presence of a potential barrier higher than the barrier to electrons with rightward spins when the electrons with leftward spins are injected into first ferromagnetic free layer 15-1. As a result, each of the reflected electrons exerts a torque that directs the direction of the magnetization in second ferromagnetic free layer 15-2 leftward. A similar phenomenon appears also at the interface with ferromagnetic fixed layer 13. However, since the current density I of the current injected from free layer electrode 16 has the relationship given as $Ic_1 > I > Ic_2$ with $Ic_1$ and $Ic_2$, only the direction of magnetization in second ferromagnetic free layer 15-2 is reversed. This causes the magnetization of second ferromagnetic free layer 15-2 to make a transition into a state in which the direction of the magnetization is in anti-parallel with the direction of the magnetization of ferromagnetic fixed layer 13. The state is referred to as the state of the logical value "1".

Subsequent to this, transition to the logical value "2" will be explained. FIG. 2C shows the case in which a current flows from fixed layer electrode 12 toward free layer electrode 16 is increased in the state of the logical value "1" to let the current flow with the current density I given as $I > Ic_1 > Ic_2$. In this case, as shown in FIG. 2C, by the interaction of electrons having leftward spins, reflected at the surface of ferromagnetic fixed layer 13, with the magnetization in first ferromagnetic free layer 15-1, the direction of the magnetization in first ferromagnetic free layer 15-1 is reversed. This causes the magnetization of first ferromagnetic free layer 15-1 to make a transition into a state in which the direction of the magnetization is in anti-parallel with the direction of the magnetization of ferromagnetic fixed layer 13 like the direction of the magnetization in second ferromagnetic free layer 15-2. The state is referred to as the state of the logical value "2".

The relationships between the logical values of the recorded information and the directions of the magnetization in the ferromagnetic layers are summarized as shown in Table 1. By thus controlling the direction and the magnitude of current flow in the element, information with multi-valued data can be recorded in one element.

In the foregoing, the explanation was made about the case where two layers of ferromagnetic free layers are given. In the case where ferromagnetic layers is increased in number to n layers, with a magnetization reversal current density $Ic_j$ in each ferromagnetic free layer determined so as to satisfy the relation $Ic_{j-1} > Ic_j$, the writing is carried out as follows. First, a current is flowed from free layer electrode 16 toward fixed layer electrode 12 with a current density I larger than $Ic_1$. Since $Ic_1$ is the largest of all of the magnetization reversal current densities Ic, the direction of magnetization in each ferromagnetic free layer is aligned in the direction of the magnetization of the ferromagnetic fixed layer. Next, for providing magnetization reversal in a j-th ferromagnetic free layer, it is necessary only that a current is flowed from fixed layer electrode 12 toward free layer electrode 16 with a current density I given as $Ic_{j-1} > I > Ic_j$. As a result, the directions of the magnetization in the n-th ferromagnetic free layer to the j-th ferromagnetic free layer are to be aligned in the direction opposite to the direction of the magnetization of the ferromagnetic fixed layer 13. Moreover, the directions of the magnetization in the (j−1)-th ferromagnetic free layer to the first ferromagnetic free layer are to be aligned in the direction the same as the direction of the magnetization of ferromagnetic fixed layer 13. Thus, at one of boundaries, each being between magnetic free layers adjacent to each other, the direction of magnetization is reversed.

TABLE 1

| Logical Value | Direction of Magnetization in Ferromagnetic Fixed Layer | Direction of Magnetization in 1st Ferromagnetic Free Layer | Direction of Magnetization in 2nd Ferromagnetic Free Layer |
| --- | --- | --- | --- |
| 0 | Rightward | Rightward | Rightward |
| 1 | Rightward | Rightward | Leftward |
| 2 | Rightward | Leftward | Leftward |

Next, an explanation will be made about the read-out of information recorded in the element. For read-out of information, resistance of the element is measured with a current made to flow with a small current density I of such a degree that causes no reversal of the magnetization in each of the ferromagnetic free layers. Since the magnetization reversal current density in the n-th ferromagnetic free layer is the minimum, I can be taken as I<$Ic_n$. A current made to flow in any direction enables read-out. However, the read-out is carried out by an operation principle that differs depending on the direction of current flow.

Figure 3A:
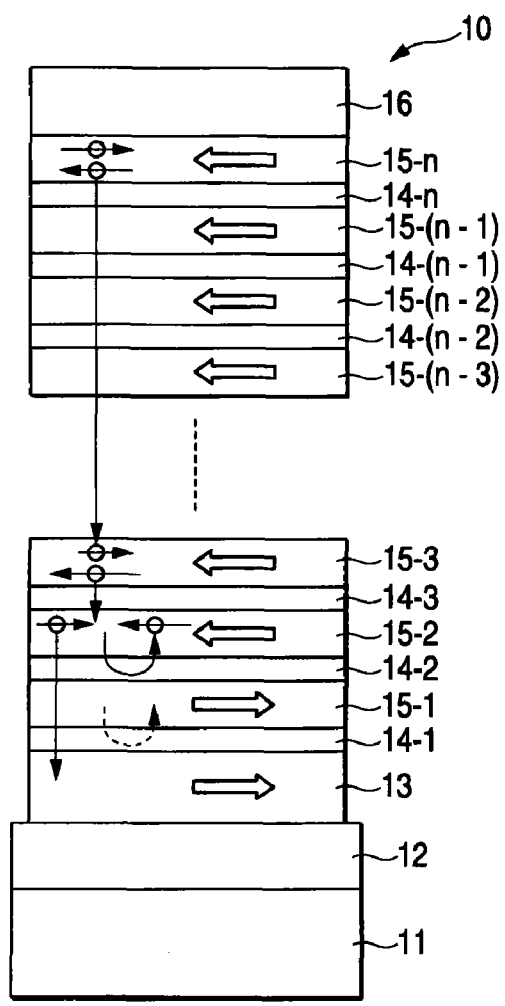
FIGS. 3A and 3B are schematic cross sectional views for explaining an operation principle of reading out in the magnetic memory element according to the invention when letting a current flow in the direction from a fixed layer electrode toward a free layer electrode.
Figure 3B:
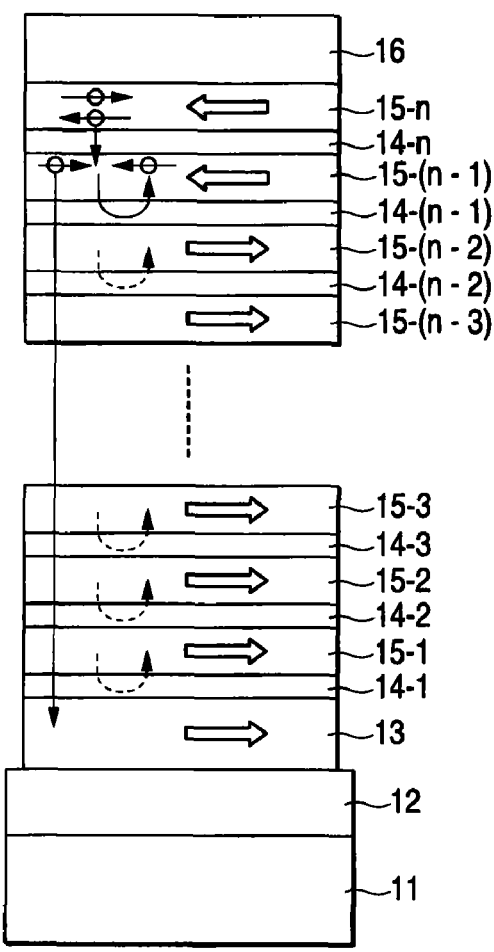

First, an explanation will be made about the case of letting a current flow in the direction from fixed layer electrode 12 toward free layer electrode 16, that is, the case in which electrons move from free layer electrode 16 toward fixed layer electrode 12. The principle of the read-out is based on relaxation of electron spins occurring in a magnetic layer. FIGS. 3A and 3B are schematic cross sectional views for explaining the operation principle of read-out in the magnetic memory element according to the invention when letting a current flow in the direction from fixed layer electrode 12 toward free layer electrode 16. FIG. 3A shows a state taken as an example in which state a direction of magnetization is reversed between first ferromagnetic free layer 15-1 and second ferromagnetic free layer 15-2. FIG. 3B shows a state taken as an example in which state a direction of magnetization is reversed between (n−2)-th ferromagnetic free layer 15-($n$−2) and (n−1)-th ferromagnetic free layer 15-($n$−1). In the figures, U-shaped arrows represent reflection of electrons with solid lines showing major strong reflection and broken lines showing weak reflection.

Electrons injected into magnetic layers interact with the magnetic layers when moving in the magnetic layers. The directions of electron spins are kept for a distance several times the mean free path of the electrons. The electron spins, however, are made relaxed in time to align the directions thereof in the direction of magnetization of the magnetic layer in which the electrons are passing. The average distance traveled by electrons before electron spins are relaxed is referred to as a spin relaxation length, which is 100 to 200 nm in metal. In free layer electrode 16, the distribution of electrons with rightward spins matches the distribution of electrons with leftward spins. However, as the electrons move in the ferromagnetic free layers, electron spins are polarized. Since the degree of spin relaxation varies depending on the distance which the electrons move, the state of polarization of electron spins is varied depending on the distance which the electrons move. In the state shown in FIG. 3A, the direction of magnetization in each of the ferromagnetic free layers from n-th ferromagnetic free layer 15-$n$ to second ferromagnetic free layer 15-2 is leftward. Therefore, there is a gradual increase in degree of leftward polarization of the electron spins. When the electrons are injected into first ferromagnetic free layer 15-1, there is a high potential barrier to the electrons with leftward spins the directions of which are opposite to the direction of the magnetization in first ferromagnetic free layer 15-1. Therefore, the reflectivity of the electrons with leftward spins becomes high to result in high resistance value of the element.

Compared with this, in the case shown in FIG. 3B, the direction of magnetization is reversed from leftward to rightward at the (n−2) ferromagnetic free layer. Hence, the moving distance of the electrons is short and the degree of spin polarization is also small. Therefore, the reflection when the electrons are injected into (n−2) ferromagnetic free layer 15-($n$−2) becomes weak. This causes the resistance value of the element to become small compared with the value in the case shown in FIG. 3A.

Accordingly, the resistance value of the element differs depending on the position of the ferromagnetic free layer from which the direction of magnetization is reversed. Thus, by using the difference in resistance value, recorded information can be read out.

Next, explanations will be made about the case in which a current is flowed in the direction from free layer electrode 16 toward fixed layer electrode 12, that is, the case in which electrons move from fixed layer electrode 12 toward free layer electrode 16. The principle of read-out in this case is based on the fact that the reflectivity of the electrons at an interface between adjacent layers differs depending on the distribution of electron spins. FIGS. 4A and 4B are schematic cross sectional views for explaining the operation principle of read-out in the magnetic memory element according to the invention when letting a current flow in the direction from free layer electrode 16 toward fixed layer electrode 12. FIG. 4A shows a state taken as an example in which state a direction of magnetization is reversed between first ferromagnetic free layer 15-1 and second ferromagnetic free layer 15-2. FIG. 4B shows a state taken as an example in which state a direction of magnetization is reversed between (n−2)-th ferromagnetic free layer 15-($n$−2) and (n−1)-th ferromagnetic free layer 15-($n$−1).

The reflectivity of electrons injected into an adjacent layer varies depending on the distribution of electron spins and becomes higher with an increase in number of electrons with spins the directions of which are opposite to the direction of magnetization in the layer into which the electrons are injected. In fixed layer electrode 12, the distribution of electrons with rightward spins matches the distribution of electrons with leftward spins. However, because of the large thickness of ferromagnetic fixed layer 13, most of the spins of electrons injected into ferromagnetic fixed layer 13 are aligned in the direction of the magnetization in ferromagnetic fixed layer 13, that is, aligned rightward in the state in the examples shown in FIGS. 4A and 4B. When the electrons move in ferromagnetic free layers with the rightward magnetization, the same magnetization direction as that in ferromagnetic fixed layer 13, the rightward spin polarization is maintained, though there is a change of increasing the degree of rightward spins of the electrons. Moreover, a small number of electrons with leftward spins inhibit reflection of the electrons at an interface between adjacent layers. In the state of the example shown in FIG. 4A, when electrons are injected into second ferromagnetic free layer 15-2, reversed magnetization in second ferromagnetic free layer 15-2 causes a part of electrons with rightward spins to be reflected at the interface. When electrons are injected into ferromagnetic free layer 15-3, the small film thickness of the layer causes reflection of the injected electrons with rightward spins to be limited to a part thereof, by which the rightward spin polarization of the electrons is maintained. Therefore, from second ferromagnetic free layer 15-2 to n-th ferromagnetic free layer 15-$n$, similar kinds of reflection are repeated while reducing the degree of rightward spin polarization. As a result, the resistance value of the element is high.

Compared with this, in the state of the example shown in FIG. 4B, the reversed direction of magnetization in (n−1)-th ferromagnetic free layer 15-($n$−1) results in reduction in opportunity of electron reflection at an inter face between adjacent layers. As a result, the resistance value of the element is lower as compared to the resistance value of the element in the state of the example shown in FIG. 4A.

Thus, the resistance value of the element differs depending on the position of the ferromagnetic free layer in which the direction of magnetization is reversed. The use of the resistance value enables read-out of recorded information.

Structures of Layers

In the following, explanations will be made about the structures of layers forming the element.

The material of substrate 11 can be selected as required depending on the desired flatness when the material has an insulation property for individually controlling a plurality of the elements arranged on the substrate and has sufficient rigidity for holding the elements. For example, an insulating substrate of such a material as sapphire or silicon oxide with a thickness of several hundreds of micrometers or a semiconductor substrate such as Si whose surface is oxidized to ensure insulating property can be used.

The material of fixed layer electrode 12 can be selected as required when it is a conductive material. The thickness thereof is preferably within the range from several tens of nanometers to several hundreds of nanometers and the area thereof is preferably within the range from 20 nm×20 nm to 10 μm×10 μm. Moreover, the shape thereof is preferably a rectangle, but can be a circle or an oval as desired.

Ferromagnetic fixed layer 13 and the ferromagnetic free layers are preferably stacked with the same shape except for their thicknesses. The direction of alignment of the magnetization in each of the ferromagnetic layers is preferably a specified direction in parallel with the surface of the substrate (the left to right direction in FIG. 1, for example). For aligning the magnetization in such a direction, it is effective that the ferromagnetic layer has shape anisotropy. Therefore, when the length L is taken in the direction of aligning the magnetization and the width W is taken in the direction orthogonal to this, the ferromagnetic fixed layer and the ferromagnetic free layers are preferably formed with $L/W \geq 2$.

For determining the magnetization reversal current density in each of n layers of the ferromagnetic free layers in the order of making $Ic_{j-1} > Ic_j$ hold, one of the following approaches is taken.

(1) To determine uniaxial magnetic anisotropy constants (Ku) in the specified order. Specifically, letting the Ku of the j-th ferromagnetic free layer be Kuj, to determine the Kuj so as to make Kuj−1>Kuj (where $2 \leq j \leq n$) hold.

(2) To determine coercive forces (Hc) in the specified order. Specifically, letting the Hc of the j-th ferromagnetic free layer be Hcj, to determine the Hcj so as to make Hcj−1>Hcj (where $2 \leq j \leq n$) hold.

3) To determine values of saturation magnetization (Ms) in the specified order. Specifically, letting the Ms of the j-th ferromagnetic free layer be Msj, to determine the Msj so as to make Msj−1>Msj (where $2 \leq j \leq n$) hold.

Magnetic metal, ferromagnetic semiconductor or ferromagnetic oxide can be used as the magnetic material of the ferromagnetic free layer. For example, a metal or an alloy such as Co, a CoCr alloy, a CoPtCr alloy, a CoPtCrB alloy, a CoPtCrTaB alloy, a permalloy group alloy (such as a $Ni_{80}Fe_{20}$ alloy or a NiFeMo alloy, for example), Fe, an FeCo group alloy (such as CoFeB, NiCoFe or FeCoN, for example), a NiMnSb alloy, a $Co_2MnAl$ alloy, a $Co_2MnSi$ alloy, a $Co_2MnGe$ alloy, a CoCrFeAl alloy, an FePt alloy, a $Sr_2FeMoO_6$ alloy, an $Fe_2O_3$ alloy, a CoHfTa alloy, a CoZrNb alloy, an FeAlN alloy or an FeTaN can be used.

In particular, the CoCr group alloy, a CoPt group alloy or a CoPtCr group alloy is preferable. This is because an adjustment of a concentration of Pt or Cr allows a wide range adjustment of Ku or Hc to thereby enable the magnetization reversal current density in each of the ferromagnetic free layers to be easily determined at a desired value. For determining Ku, the concentration of Pt is preferably adjusted. Letting the Pt concentration in the j-th ferromagnetic free layer be $P_j$, by determining the $P_j$ so as to make $P_{j-1} > P_j$ (where $2 \leq j \leq n$) hold, Ku can be determined in the desired order. For suitably determining Ku, the concentration of Pt is preferably taken as being between 0.1 atomic percent and 20 atomic percent. The concentration of Pt determined within the range can vary uniaxial magnetic anisotropic energy within the range of the order of $10^5$ to $10^7$ erg/cm³. For determining Hc, the concentration of Cr is preferably adjusted. Letting the Cr concentration in the j-th ferromagnetic free layer be $C_j$, by determining the $C_j$ so as to make $C_{j-1} > C_j$ (where $2 \leq j \leq n$) hold, Hc can be determined in the desired order. For suitably determining Hc, the concentration of Cr is preferably taken as being between 0.1 atomic percent and 20 atomic percent.

The film thickness of each of the ferromagnetic free layers must be smaller than the relaxation length of electron spin. Since the relaxation length of electron spin is of the order of 100 to 200 nm, the film thickness of each of the ferromagnetic free layers is preferably 50 nm or less. A film thickness between 5 nm and 20 nm is particularly preferable to suitably control the polarized state of electron spin.

For the magnetic material of ferromagnetic fixed layer 13, a material having a large magnetic anisotropy constant and a large coercive force is preferable. In particular, a material such as Co, a CoPt alloy, FePt, CoCr, CoPtCr, CoPtCrB, CoPtCrTaB, a CoPt artificial lattice film, a CoPd artificial lattice film or a CoPtCr—$SiO_2$ granular film is preferable. The film thickness of ferromagnetic fixed layer 13, for sufficiently fixing magnetization and uniformly aligning the direction of electron spin, is preferably large. Specifically, the thickness is preferably taken as 50 nm or more.

For the material of each of the isolation layers, nonmagnetic metal or oxide can be used. When using nonmagnetic metal, Cu, V, Nb, Mo, Rh, Ta, W, Re, Ir, Pt or Pd is preferable. When using oxide, oxide of aluminum or MgO is preferable. Moreover, a two-layer laminated film with a film of the nonmagnetic metal and a film of the oxide can be used. The thickness of each of the isolation layers is preferably made to be 1 nm or more for ensuring magnetic isolation between the ferromagnetic layers and is, for reducing electric resistance, preferably made to be 10 nm or less.

The material of free layer electrode 16 can be selected as required when it is a conductive material. The thickness thereof is preferably from several tens of nanometers to several hundreds of nanometers and the shape thereof is preferably equal to those of the ferromagnetic free layers.

Figure 8A:
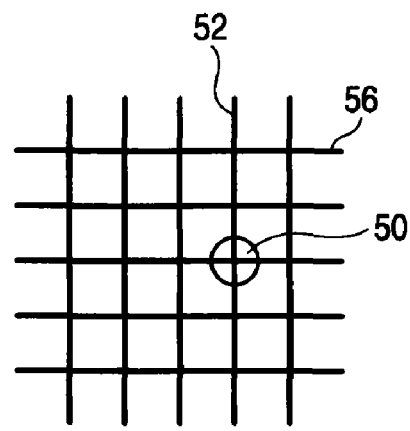
FIG. 8A is a view showing a basic structure of an MRAM.

By integrating a plurality of the unit elements on a substrate, a large-scale random access memory device can be formed. For forming the device, the arrangement shown in FIG. 8A is used, for example, with the above-described elements disposed as memory elements 50.

Other Embodiments

The arrangement shown in FIG. 1 is presented as a basic arrangement of the magnetic memory element according to the invention, which can be modified depending on the purpose for which the element is employed with the constituents thereof changed as required. Examples of the modification will be shown in the following.

Figure 5:
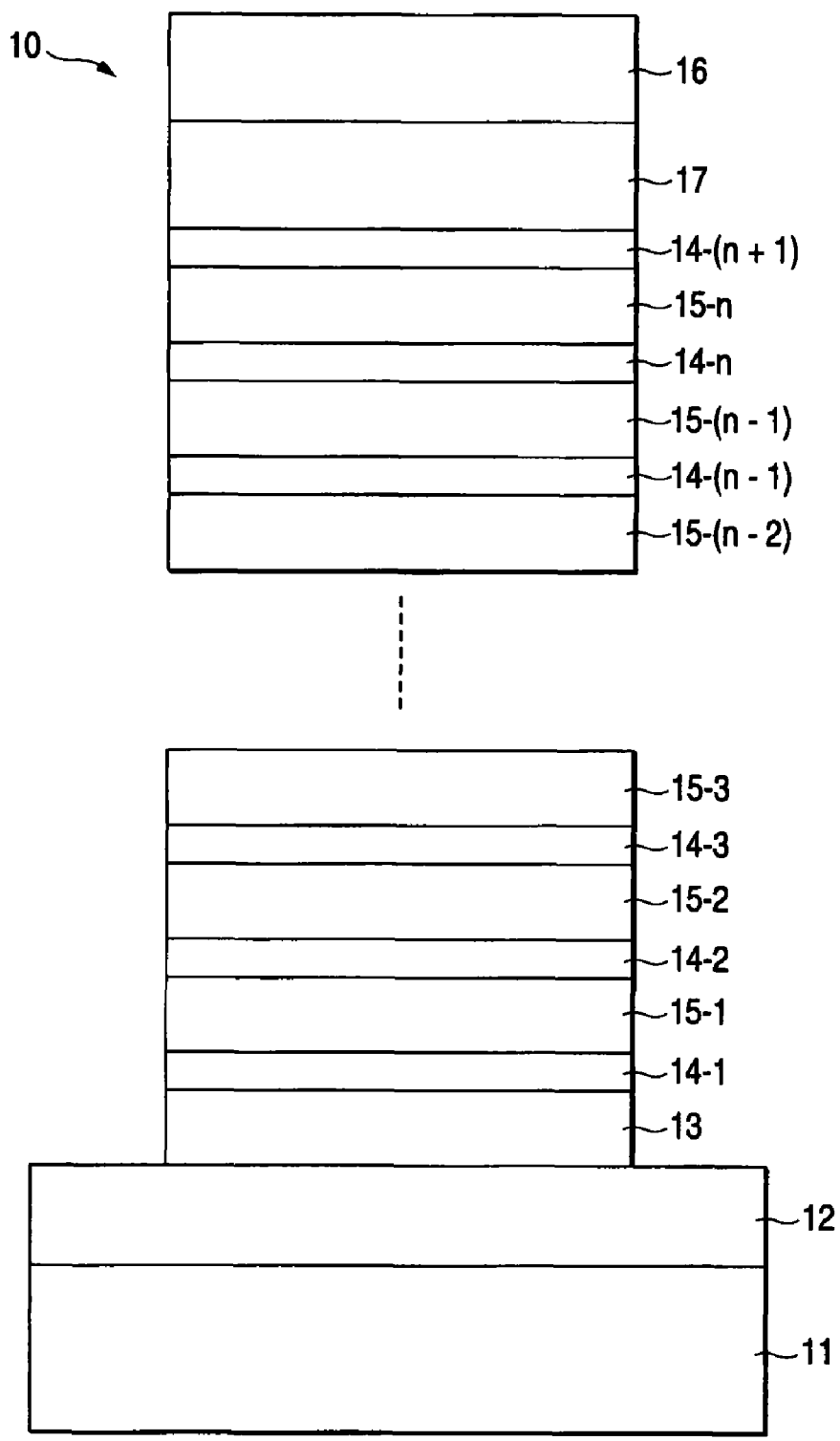
FIG. 5 is a schematic cross sectional view showing an example of another arrangement of the magnetic memory element according to the invention in which a ferromagnetic supplementary fixed layer is provided.

FIG. 5 is a schematic cross sectional view showing an example of another arrangement of the magnetic memory element according to the invention in which ferromagnetic supplementary fixed layer 17 is provided between free layer electrode 16 and n-th ferromagnetic free layer 15-n with an (n+1)-th isolation layer held between ferromagnetic supplementary fixed layer 17 and n-th ferromagnetic free layer 15-n. N-th ferromagnetic free layer 15-n is a layer into which writing with magnetization reversal by electrons injected from free layer electrode 16 is difficult compared with other ferromagnetic free layers. This is because the distribution of electrons with rightward spins matches the distribution of electrons with leftward spins in free layer electrode 16. Ferromagnetic supplementary fixed layer 17 is for supporting the magnetization reversal in n-th ferromagnetic free layer 15-n by weakly polarizing electric spins beforehand. Therefore, the direction of the magnetization in ferromagnetic supplementary fixed layer 17 is determined to be opposite to that in ferromagnetic fixed layer 13 and is fixed. The film thickness of ferromagnetic supplementary fixed layer 17 is preferably of sufficient thickness to weakly polarize electron spins. The thickness is preferably 20 nm to 50 nm, which is less than the spin relaxation length. For fixing the direction of magnetization in a film with a small thickness, Ku is preferably determined to be high. In particular, Ku is preferably determined to be higher than the Ku in ferromagnetic fixed layer 13. For the material thereof, a material the same as that of ferromagnetic fixed layer 13 can be used.

Figure 6A:
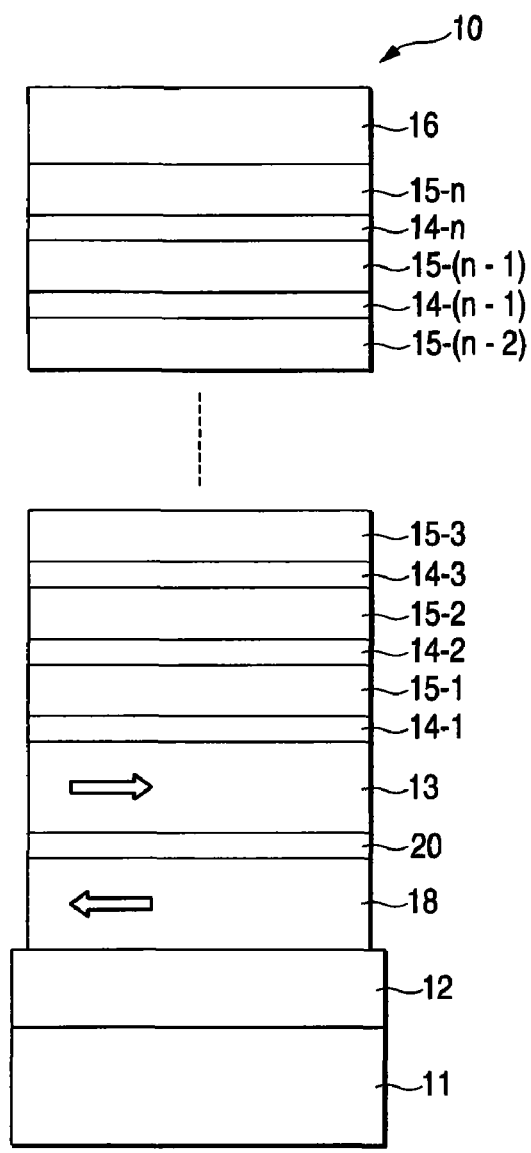
FIGS. 6A and 6B are schematic cross sectional views each showing an example of further another arrangement of the magnetic memory element according to the invention with FIG. 6A showing an example of an arrangement in which a ferromagnetic layer provides anti-ferromagnetic coupling between a ferromagnetic fixed layer, and FIG. 6B showing an example of an arrangement in which a ferromagnetic layer provides ferromagnetic coupling between the ferromagnetic fixed layer.
Figure 6B:
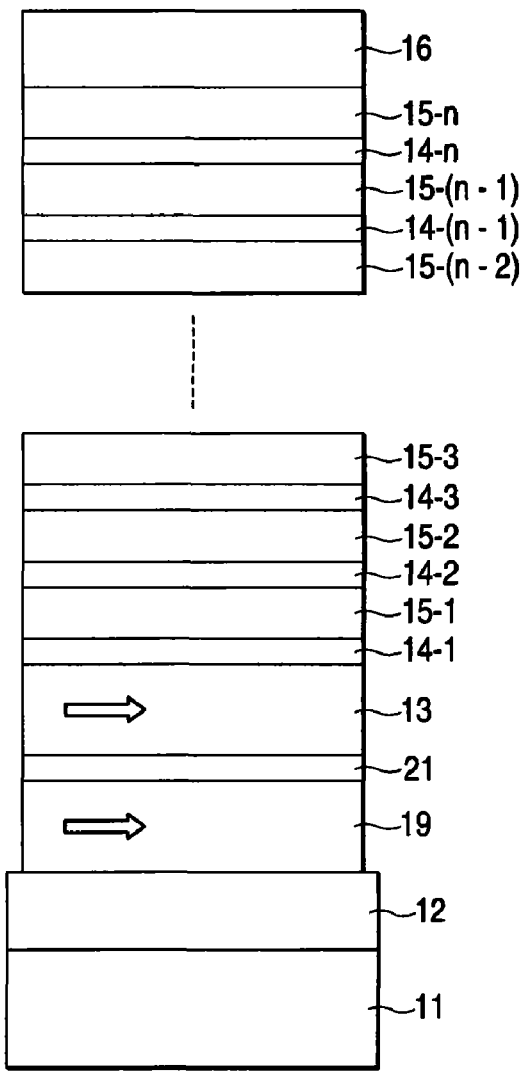

FIGS. 6A and 6B are schematic cross sectional views each showing an example of yet another arrangement of fixing the magnetization of ferromagnetic fixed layer 13 in the magnetic memory element according to the invention. FIG. 6A shows an example of an arrangement in which ferromagnetic layer 18 is provided between ferromagnetic fixed layer 13 and fixed layer electrode 12 with nonmagnetic anti-ferromagnetic coupling layer 20 held between them to provide anti-ferromagnetic coupling between ferromagnetic fixed layer 13 and ferromagnetic layer 18. FIG. 6B shows an example of an arrangement in which ferromagnetic layer 19 is provided with nonmagnetic ferromagnetic coupling layer 21 held between ferromagnetic layer 19 and ferromagnetic fixed layer 13 to provide ferromagnetic coupling between ferromagnetic fixed layer 13 and ferromagnetic layer 19. For the materials and the arrangements of ferromagnetic layer 18 and ferromagnetic layer 19, known ones can be used. For fixing the magnetization of ferromagnetic fixed layer 13, another known arrangement can be used.

Figure 7:
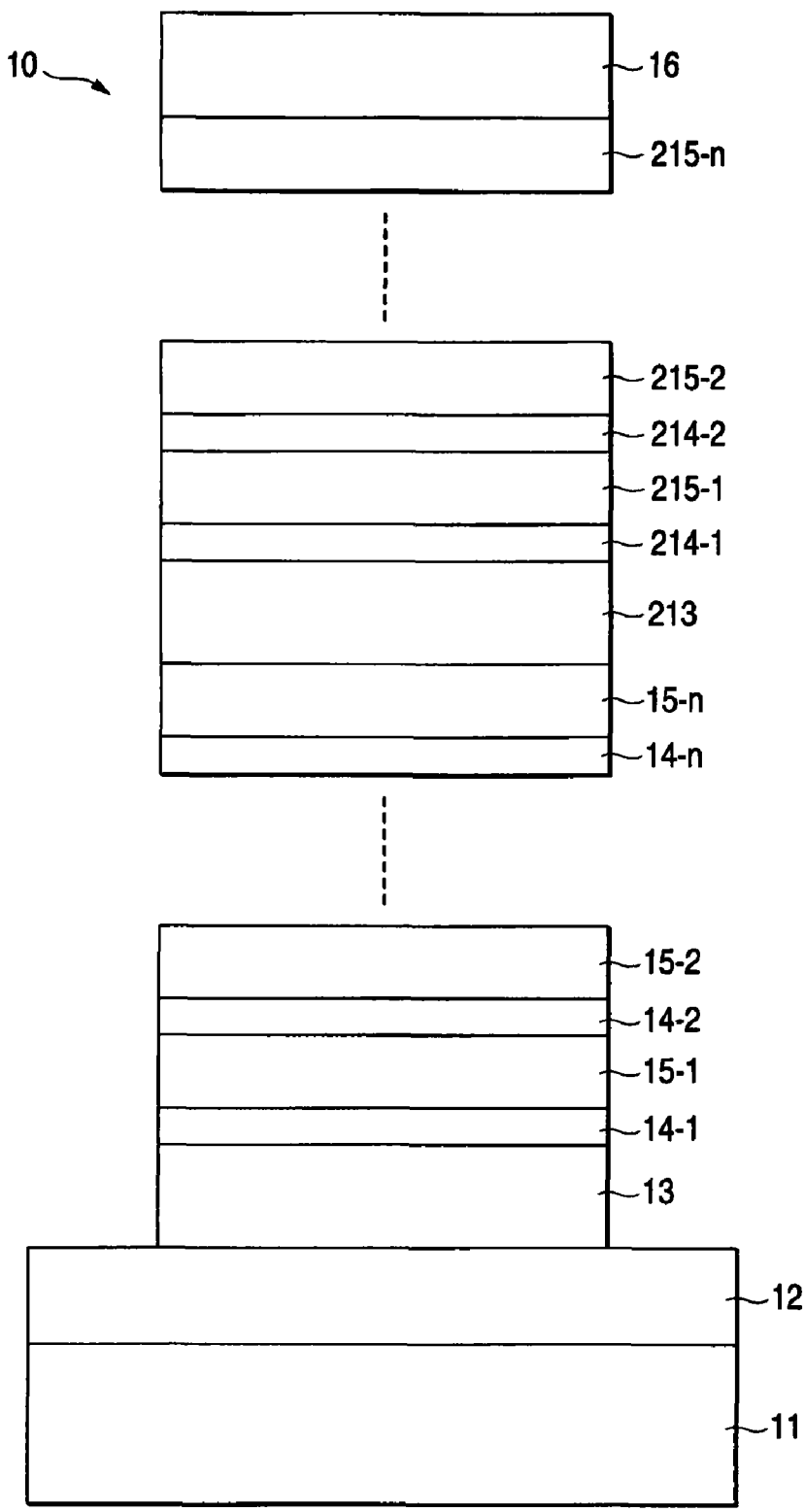
FIG. 7 is a schematic cross sectional view showing an example of still another arrangement of the magnetic memory element according to the invention in which the basic arrangement sections of the element according to the invention are stacked.

FIG. 7 is a schematic cross sectional view showing an example of still another arrangement of the magnetic memory element according to the invention in which the basic arrangement sections of element 10 according to the invention are stacked. On the section from ferromagnetic fixed layer 13 to n-th ferromagnetic free layer 15-n, one more section from ferromagnetic fixed layer 213 to n-th ferromagnetic free layer 215-n equivalent to the above section is stacked. Similarly, three or more of the sections can be stacked. This enables a further increase in number of levels of multi-valued data.

Moreover, when writing into the element is carried out in a way other than the spin injection, the element can be used as a sensor. For example, the element is placed in a magnetic field for magnetization reversal in ferromagnetic free layers by the magnetic field. After this, by using the above-described way of reading, the position of a ferromagnetic free layer, in which the magnetization reversal is occurred, can be detected. For example, the ferromagnetic free layers arranged in the order of coercive forces enable the element to be used as a magnetic field sensor.

EXAMPLE 1

By using the arrangement shown in FIG. 1, a GMR magnetic memory element was made in which two layers of ferromagnetic layers were provided and nonmagnetic metal was used for the isolation layers.

For nonmagnetic substrate 11, a Si substrate was used. On the Si substrate, a Cu film was deposited to a thickness of 200 nm as fixed layer electrode 12 with a shape of 1 μm in width and 10 μm in length. Subsequent to this, on fixed layer electrode 12, ferromagnetic fixed layer 13 was formed by using $Co_{70}Cr_{20}Pt_{10}$ to a thickness of 100 nm with a shape of 500 nm in width and 1 μm in length. (Here, subscript numerals represent atomic percentages. The same applies to the following.) Following this, the following layers were formed with the same length and width as those of ferromagnetic fixed layer 13. Namely, first isolation layer 14-1 of Cu with a thickness of 1 nm, first ferromagnetic free layer 15-1 of $Co_{89}Pt_{10}Cr_1$ with a thickness of 10 nm, second isolation layer 14-2 of Cu with a thickness of 1 nm, second ferromagnetic free layer 15-2 of $Co_{96}Pt_3Cr_1$ with a thickness of 10 nm, and free layer electrode 16 of Cu with a thickness of 200 nm were formed in the order. Deposition of each of the layers was carried out by sputtering. In this way, an element having the GMR effect was obtained.

EXAMPLE 2

This is an example of making a TMR magnetic memory element. A magnetic memory element having the TMR effect was obtained in quite the same way as that in Example 1 except that an $Al_2O_3$ layer with a thickness of 1 nm was formed by sputtering as each of the first and second isolation layers 14-1 and 14-2.

By using the element in Example 2, three-valued data recording was carried out. First, Ku and Ic of each of the ferromagnetic free layers were measured, by which it was confirmed that $Ku_1$ and $Ic_1$ in the first ferromagnetic free layer were $4.0 \times 10^6$ erg/cm$^3$ and $1.0 \times 10^8$ A/cm$^2$, respectively, $Ku_2$ and $Ic_2$ in the second ferromagnetic free layer were $3.3 \times 10^6$ erg/cm$^3$ and $5.0 \times 10^7$ A/cm$^2$, respectively, and $Ku_1 > Ku_2$ and $Ic_1 > IC_2$.

Next, three-valued data were recorded and read out according to the operation modes shown in Table 1. The results of the reading out are shown in Table 2. The current densities for writing are $1.2 \times 10^8$ A/cm$^2$ for the logical value "0", $6.0 \times 10^7$ A/cm$^2$ for the logical value "1" and $1.4 \times 10^8$ A/cm$^2$ for the logical value "2". The voltage for the reading out is 1V.

TABLE 2

| Logical Value | Read out Current Value (mA) |
| --- | --- |
| 0 | 0.50 |
| 1 | 0.40 |
| 2 | 0.33 |

In the above examples, the magnetic material used for the ferromagnetic free layer was given as CoCrPt in which the ratio of composition of Pt was varied to thereby vary a magnetization reversal current density. Also in the cases in which the magnetic material is given as CoCr or CoCrPt to vary the ratio of composition of Cr between 0.1 and 20 atomic percent and the magnetic material is given as CoPt to vary the ratio of composition of Pt between 0.1 and 20 atomic percent, it is confirmed that the same effects as those in Examples 1 and 2 are obtained.

While the present invention has been particularly shown and described with reference to preferred embodiments thereof, it will be understood by those skilled in the art that the foregoing and other changes in form and details can be made therein without departing from the spirit and scope of the present invention.

Thus, a multi-valued data recording spin injection magnetization reversal element and device using the element has been described which inhibits an increase in resistance to enable multi-valued data recording. A ferromagnetic fixed layer and n groups each including a ferromagnetic free layer and an isolation layer are disclosed. The groups are disposed from the group including the first ferromagnetic free layer provided on the ferromagnetic fixed layer to the group including the n-th ferromagnetic free layer in the order. Letting a magnetization reversal current density in a j-th ferromagnetic free layer be $Ic_j$, a relation of $Ic_{j-1} > Ic_j$ (where $2 \leq j \leq n$) is satisfied, or letting a uniaxial magnetic anisotropy constant in the j-th ferromagnetic free layer be $Ku_j$, a relation of $Ku_{j-1} > Ku_j$ (where $2 \leq j \leq n$) is satisfied. Letting a coercive force in the j-th ferromagnetic free layer be $Hc_j$, a relation of $Hc_{j-1} > Hc_j$ (where $2 \leq j \leq n$) is preferably satisfied, or letting a saturation magnetization in the j-th ferromagnetic free layer be $Ms_j$, a relation of $Ms_{j-1} > Ms_j$ (where $2 \leq j \leq n$) is preferably satisfied. Each of the ferromagnetic free layers is preferably formed of one of a CoCrPt alloy, a CoCr alloy and a CoPt alloy with Pt or Cu concentration therein made monotonically decreased from the concentration in the first ferromagnetic free layer to that in the n-th ferromagnetic free layer.

Many modifications and variations may be made to the techniques and structures described and illustrated herein without departing from the spirit and scope of the invention. Accordingly, it should be understood that the elements and devices described herein are illustrative only and are not limiting upon the scope of the invention.

| KEY TO FIGURES | |
| --- | --- |
| FIG. 1 | |
| 11 | SUBSTRATE |
| 12 | FIXED LAYER ELECTRODE |
| 13 | FERROMAGNETIC FIXED LAYER |
| 14-1 | FIRST ISOLATION LAYER |
| 15-1 | FIRST FERROMAGNETIC FREE LAYER |
| 14-2 | SECOND ISOLATION LAYER |
| 15-2 | SECOND FERROMAGNETIC FREE LAYER |
| 14-3 | THIRD ISOLATION LAYER |
| 15-3 | THIRD FERROMAGNETIC FREE LAYER |
| 15-(n − 2) | (n − 2)-TH FERROMAGNETIC FREE LAYER |
| 14-(n − 1) | (n − 1)-TH ISOLATION LAYER |
| 15-(n − 1) | (n − 1)-TH FERROMAGNETIC FREE LAYER |
| 14-n | n-TH ISOLATION LAYER |
| 15-n | n-TH FERROMAGNETIC FREE LAYER |
| 16 | FREE LAYER ELECTRODE |
| FIG. 2A | |
| 12 | FIXED LAYER ELECTRODE |
| 16 | FREE LAYER ELECTRODE |
| FIG. 2B | |
| 12 | FIXED LAYER ELECTRODE |
| 16 | FREE LAYER ELECTRODE |
| FIG. 2C | |
| 12 | FIXED LAYER ELECTRODE |
| 16 | FREE LAYER ELECTRODE |
| FIG. 3A | |
| 11 | SUBSTRATE |
| 12 | FIXED LAYER ELECTRODE |
| 16 | FREE LAYER ELECTRODE |
| FIG. 3B | |
| 11 | SUBSTRATE |
| 12 | FIXED LAYER ELECTRODE |
| 16 | FREE LAYER ELECTRODE |

| -continued | |
| --- | --- |
| KEY TO FIGURES | |
| FIG. 4A | |
| 11 | SUBSTRATE |
| 12 | FIXED LAYER ELECTRODE |
| 16 | FREE LAYER ELECTRODE |
| FIG. 4B | |
| 11 | SUBSTRATE |
| 12 | FIXED LAYER ELECTRODE |
| 16 | FREE LAYER ELECTRODE |
| FIG. 5 | |
| 11 | SUBSTRATE |
| 12 | FIXED LAYER ELECTRODE |
| 13 | FERROMAGNETIC FIXED LAYER |
| 14-1 | FIRST ISOLATION LAYER |
| 15-1 | FIRST FERROMAGNETIC FREE LAYER |
| 14-2 | SECOND ISOLATION LAYER |
| 15-2 | SECOND FERROMAGNETIC FREE LAYER |
| 14-3 | THIRD ISOLATION LAYER |
| 15-3 | THIRD FERROMAGNETIC FREE LAYER |
| 15-(n − 2) | (n − 2)-TH FERROMAGNETIC FREE LAYER |
| 14-(n − 1) | (n − 1)-TH ISOLATION LAYER |
| 15-(n − 1) | (n − 1)-TH FERROMAGNETIC FREE LAYER |
| 14-n | n-TH ISOLATION LAYER |
| 15-n | n-TH FERROMAGNETIC FREE LAYER |
| 14-(n + 1) | (n + 1)-TH ISOLATION LAYER |
| 17 | FERROMAGNETIC SUPPLEMENTARY FIXED LAYER |
| 16 | FREE LAYER ELECTRODE |
| FIG. 6A | |
| 11 | SUBSTRATE |
| 12 | FIXED LAYER ELECTRODE |
| 18 | FERROMAGNETIC LAYER |
| 20 | ANTIFERROMAGNETIC COUPLING LAYER |
| 13 | FERROMAGNETIC FIXED LAYER |
| 14-1 | FIRST ISOLATION LAYER |
| 15-1 | FIRST FERROMAGNETIC FREE LAYER |
| 14-2 | SECOND ISOLATION LAYER |
| 15-2 | SECOND FERROMAGNETIC FREE LAYER |
| 14-3 | THIRD ISOLATION LAYER |
| 15-3 | THIRD FERROMAGNETIC FREE LAYER |
| 15-(n − 2) | (n − 2)-TH FERROMAGNETIC FREE LAYER |
| 14-(n − 1) | (n − 1)-TH ISOLATION LAYER |
| 15-(n − 1) | (n − 1)-TH FERROMAGNETIC FREE LAYER |
| 14-n | n-TH ISOLATION LAYER |
| 15-n | n-TH FERROMAGNETIC FREE LAYER |
| 16 | FREE LAYER ELECTRODE |
| FIG. 6B | |
| 11 | SUBSTRATE |
| 12 | FIXED LAYER ELECTRODE |
| 19 | FERROMAGNETIC LAYER |
| 21 | FERROMAGNETIC COUPLING LAYER |
| 13 | FERROMAGNETIC FIXED LAYER |
| 14-1 | FIRST ISOLATION LAYER |
| 15-1 | FIRST FERROMAGNETIC FREE LAYER |
| 14-2 | SECOND ISOLATION LAYER |
| 15-2 | SECOND FERROMAGNETIC FREE LAYER |
| 14-3 | THIRD ISOLATION LAYER |
| 15-3 | THIRD FERROMAGNETIC FREE LAYER |
| 15-(n − 2) | (n − 2)-TH FERROMAGNETIC FREE LAYER |
| 14-(n − 1) | (n − 1)-TH ISOLATION LAYER |
| 15-(n − 1) | (n − 1)-TH FERROMAGNETIC FREE LAYER |
| 14-n | n-TH ISOLATION LAYER |
| 15-n | n-TH FERROMAGNETIC FREE LAYER |
| 16 | FREE LAYER ELECTRODE |
| FIG. 7 | |
| 11 | SUBSTRATE |
| 12 | FIXED LAYER ELECTRODE |
| 13 | FERROMAGNETIC FIXED LAYER |
| 14-1 | FIRST ISOLATION LAYER |
| 15-1 | FIRST FERROMAGNETIC FREE LAYER |
| 14-2 | SECOND ISOLATION LAYER |
| 15-2 | SECOND FERROMAGNETIC FREE LAYER |
| 14-n | n-TH ISOLATION LAYER |

-continued

KEY TO FIGURES

Figure 8B:
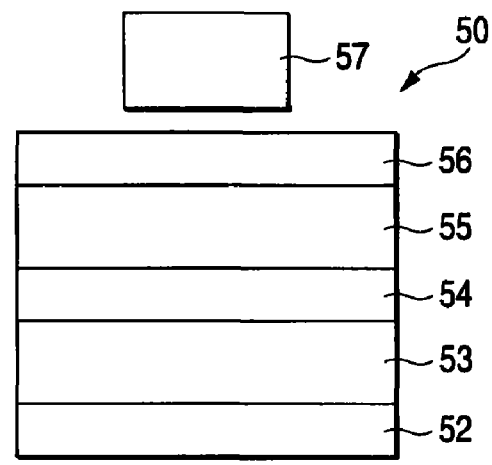
FIG. 8B is a schematic cross sectional view showing an example of an arrangement of a TMR magnetic memory element driven by a magnetic field produced by a current as a related art.
Figure 9A:
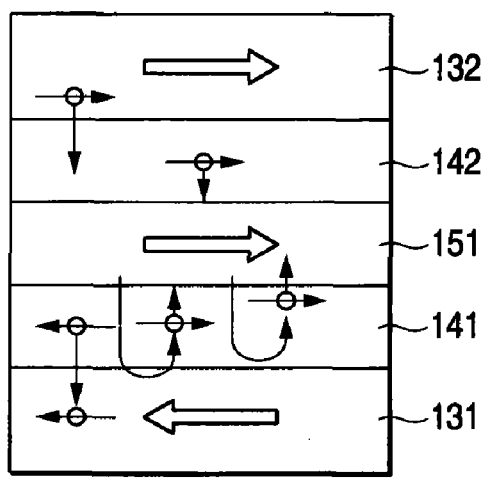
FIGS. 9A and 9B are schematic cross sectional views for explaining an example of an arrangement and an operation principle of a related magnetic memory element carrying out recording and regeneration of binary information data by using magnetization reversal due to electron spin injection.
Figure 9B:
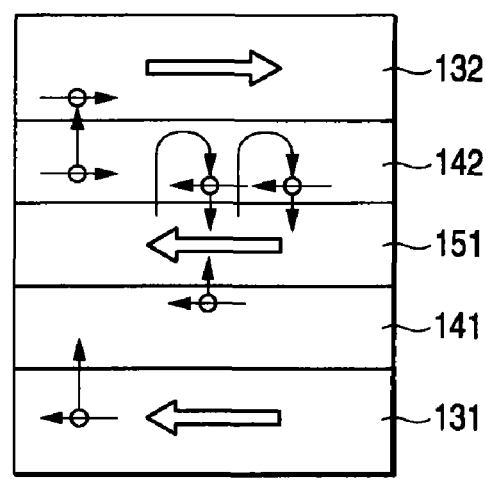
Figure 10:
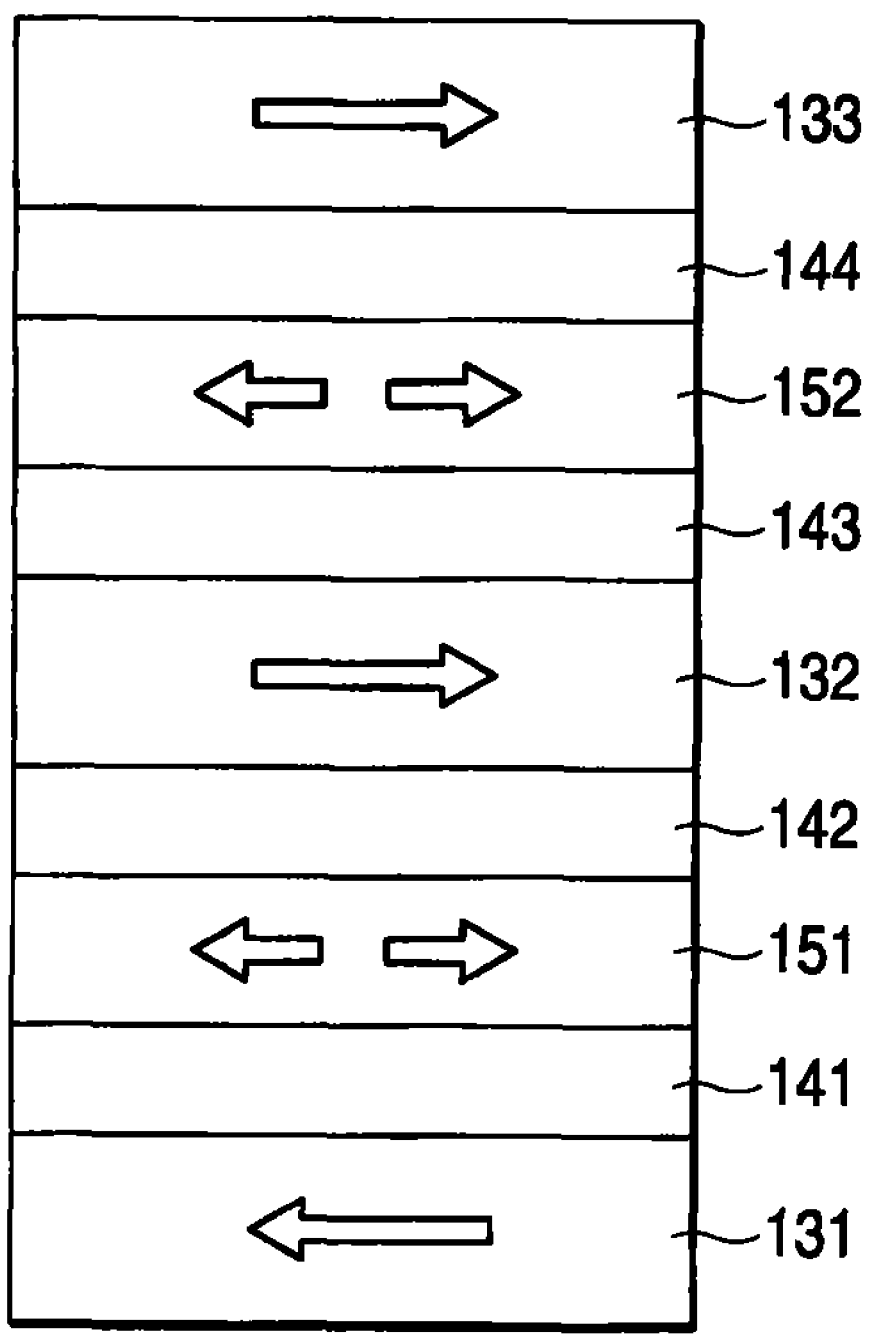
FIG. 10 is a schematic cross sectional view for explaining an arrangement of a related spin injection magnetization reversal element carrying out multi-valued data recording.

| | | |
|---|---|---|
| 15-n | n-TH FERROMAGNETIC FREE LAYER | |
| 213 | FERROMAGNETIC FIXED LAYER | |
| 214-1 | FIRST ISOLATION LAYER | |
| 215-1 | FIRST FERROMAGNETIC FREE LAYER | |
| 214-2 | SECOND ISOLATION LAYER | |
| 215-2 | SECOND FERROMAGNETIC FREE LAYER | |
| 215-n | n-TH FERROMAGNETIC FREE LAYER | |
| 16 | FREE LAYER ELECTRODE | |
| | FIG. 8B | |
| 52 | BIT LINE | |
| 53 | LOW Hc FIRST FERROMAGNETIC LAYER | |
| 54 | INSULATION LAYER | |
| 55 | HIGH Hc SECOND FERROMAGNETIC LAYER | |
| 56 | WORD LINE | |
| 57 | WRITING WORD LINE | |

What is claimed is:

1. A spin injection magnetization reversal element comprising:
a ferromagnetic fixed layer in which the direction of magnetization thereof is substantially fixed in one direction;
a plurality of ferromagnetic free layers, with the number of the layers being n from a first ferromagnetic free layer to an n-th layer, in each of which the direction of magnetization is variable; and
a plurality of nonmagnetic isolation layers with the number of the layers being n,
wherein
the first ferromagnetic free layer is disposed closest to the ferromagnetic fixed layer and the n-th ferromagnetic free layer is disposed farthest from the ferromagnetic fixed layer with the n ferromagnetic free layers from the first ferromagnetic free layer to the n-th ferromagnetic free layer being disposed in order,
one of the isolation layers being disposed between the ferromagnetic fixed layer and the first ferromagnetic free layer,
each one of the rest of the isolation layers is disposed between neighboring ferromagnetic free layers,
the direction of magnetization of each of the ferromagnetic free layers is varied by electron spin injection, and
a relation of $Ic_{j-1} > Ic_j$ (where $2 \leq j \leq n$) is satisfied in the ferromagnetic layers, where j is a number given as $1 \leq j \leq n$ and $Ic_j$ is a magnetization reversal current density in a j-th ferromagnetic free layer.

2. A spin injection magnetization reversal element comprising:
a ferromagnetic fixed layer in which the direction of magnetization thereof is substantially fixed in one direction;
a plurality of ferromagnetic free layers, with the number of the layers being n from a first ferromagnetic free layer to an n-th layer, in each of which the direction of magnetization is variable; and
a plurality of nonmagnetic isolation layers with the number of the layers being n,
wherein
the first ferromagnetic free layer is disposed closest to the ferromagnetic fixed layer and the n-th ferromagnetic free layer is disposed farthest from the ferromagnetic fixed layer with the n ferromagnetic free layers from the first ferromagnetic free layer to the n-th ferromagnetic free layer being disposed in order,
one of the isolation layers is disposed between the ferromagnetic fixed layer and the first ferromagnetic free layer,
each one of the rest of the isolation layers is disposed between neighboring ferromagnetic free layers,
the direction of magnetization of each of the ferromagnetic free layers is varied by electron spin injection, and
a relation of $Ku_{j-1} > Ku_j$ (where $2 \leq j \leq n$) is satisfied in the ferromagnetic free layers, where j is a number given as $1 \leq j \leq n$ and $Ku_j$ is a uniaxial magnetic anisotropy constant in a j-th ferromagnetic free layer.

3. The spin injection magnetization reversal element as claimed in claim 1 or 2 wherein a relation of $Hc_{j-1} > Hc_j$ (where $2 \leq j \leq n$) is satisfied in the ferromagnetic free layers, where $Hc_j$ is a coercive force in the j-th ferromagnetic free layer.

4. The spin injection magnetization reversal element as claimed in claim 1 or 2, wherein a relation of $Ms_{j-1} > Ms_j$ (where $2 \leq j \leq n$) is satisfied in the ferromagnetic free layers, where $Ms_j$ is a saturation magnetization in the j-th ferromagnetic free layer.

5. The spin injection magnetization reversal element as claimed in claim 1 or 2, wherein the length of each of the ferromagnetic free layers divided by the width thereof is a value of 2 or more.

6. The spin injection magnetization reversal element as claimed in claim 1 or 2, wherein a fixed layer electrode is provided on the surface of the ferromagnetic fixed layer on the side opposite to the ferromagnetic free layers, and a free layer electrode is provided on the surface of the n-th ferromagnetic free layer on the side opposite to the ferromagnetic fixed layer.

7. The spin injection magnetization reversal element as claimed in claim 1 or 2, wherein a nonmagnetic isolation layer and a ferromagnetic supplementary fixed layer are further provided in order on the surface of the n-th ferromagnetic free layer on the side opposite to the ferromagnetic fixed layer with the direction of magnetization of the ferromagnetic supplementary fixed layer substantially fixed in a second direction opposite to a first direction as the one direction.

8. The spin injection magnetization reversal element as claimed in claim 1, wherein each of the ferromagnetic free layers is formed of one of a CoCrPt alloy, a CoCr alloy and a CoPt alloy.

9. The spin injection magnetization reversal element as claimed in claim 8, wherein relations of $C_{j-1} > C_j$ (where $2 \leq j \leq n$) and 0.1 atomic % $\leq C_j \leq$ 20 atomic % (where $1 \leq j \leq n$) are satisfied, where $C_j$ is Cr concentration in the j-th ferromagnetic free layer.

10. The spin injection magnetization reversal element as claimed in claim 8, wherein relations of $P_{j-1} > P_j$ (where $2 \leq j \leq n$) and 0.1 atomic % $\leq C_j \leq$ 20 atomic % (where $1 \leq j \leq n$) are satisfied, where $P_j$ is Pt concentration in the j-th ferromagnetic free layer.

11. The spin injection magnetization reversal element as claimed in claim 1, wherein a material of each of the isolation layer is nonmagnetic metal.

12. The spin injection magnetization reversal element as claimed in claim 11, wherein the nonmagnetic metal is Cu.

13. The spin injection magnetization reversal element as claimed in claim 1, wherein a material of each of the isolation layer is an insulator.

14. The spin injection magnetization reversal element as claimed in claim 13, wherein the insulator is $Al_2O_3$.

* * * * *